(12) United States Patent
Lee et al.

(10) Patent No.: US 10,002,851 B2
(45) Date of Patent: Jun. 19, 2018

(54) SEMICONDUCTOR PACKAGES INCLUDING CHIP ENABLEMENT PADS

(71) Applicant: SK hynix Inc., Icheon-si, Gyeonggi-do (KR)

(72) Inventors: Ki Yong Lee, Seoul (KR); Sang Hwan Kim, Seoul (KR); Hyung Ju Choi, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 49 days.

(21) Appl. No.: 15/248,435

(22) Filed: Aug. 26, 2016

(65) Prior Publication Data
US 2017/0294411 A1    Oct. 12, 2017

(30) Foreign Application Priority Data
Apr. 11, 2016  (KR) .................... 10-2016-0044094

(51) Int. Cl.
| H01L 23/48 | (2006.01) |
| H01L 25/065 | (2006.01) |
| H01L 21/105 | (2006.01) |
| H01L 25/18 | (2006.01) |
| H01L 23/00 | (2006.01) |

(52) U.S. Cl.
CPC ........ H01L 25/0657 (2013.01); H01L 21/105 (2013.01); H01L 24/49 (2013.01); H01L 25/065 (2013.01); H01L 25/0652 (2013.01); H01L 25/18 (2013.01); H01L 2225/0651 (2013.01); H01L 2225/0652 (2013.01); H01L 2225/06506 (2013.01); H01L 2225/06548 (2013.01); H01L 2225/06562 (2013.01)

(58) Field of Classification Search
CPC ....... H01L 25/0657; H01L 2225/06562; H01L 2225/06548; H01L 2225/0651; H01L 2225/06506; H01L 2225/0652; H01L 25/18; H01L 24/49; H01L 25/0652; H01L 25/065; H01L 25/105; H01L 25/0655
USPC ............ 257/777; 365/63, 230.03, 230.06, 52
See application file for complete search history.

(56) References Cited

U.S. PATENT DOCUMENTS

| 7,710,754 | B2 | 5/2010 | Kao |
| 9,286,950 | B2 * | 3/2016 | Kim .................... G11C 5/063 |

(Continued)

FOREIGN PATENT DOCUMENTS

KR    1020140010554 A    1/2014

*Primary Examiner* — Shouxiang Hu
(74) *Attorney, Agent, or Firm* — William Park & Associates LTD.

(57) ABSTRACT

A semiconductor package includes a package substrate and semiconductor chips stacked on the package substrate. The package substrate may include at least one first chip enablement finger, at least one second chip enablement finger, and a chip enablement pad selection finger. Each of the semiconductor chips includes a first chip enablement pad connected to the at least one first chip enablement finger, a second chip enablement pad connected to the at least one second chip enablement finger, and a chip enablement pad selection pad connected to the chip enablement pad selection finger. The first chip enablement pads of the semiconductor chips or the second chip enablement pads of the semiconductor chips are optionally activated by a signal applied to the chip enablement pad selection finger.

4 Claims, 7 Drawing Sheets

(56) References Cited

U.S. PATENT DOCUMENTS

2011/0079890 A1* 4/2011 Song ................... H01L 23/16
                                                        257/686
2013/0148401 A1* 6/2013 Fai .................... G11C 5/063
                                                         365/63
2015/0325560 A1* 11/2015 Fai ................... H01L 23/5384
                                                        257/774

* cited by examiner

SEMICONDUCTOR PACKAGES INCLUDING CHIP ENABLEMENT PADS

CROSS-REFERENCE TO RELATED APPLICATIONS

The present application claims priority under 35 U.S.C. §119(a) to Korean Patent Application No. 10-2016-0044094 filed on Apr. 11, 2016, which is incorporated herein by reference in its entirety.

BACKGROUND

1. Technical Field

Embodiments of the present disclosure generally relate to semiconductor packages, and, more particularly, to semiconductor packages including chip enablement pads.

2. Related Art

In the electronics industry, multi-chip stack packages are being developed to meet the demand for multi-functional, high-capacity, small-sized semiconductor devices. The multi-chip stack packages may be produced by mounting a plurality of semiconductor chips on a package substrate. For example, the multi-chip stack packages may have four or more stacked semiconductor chips therein. Each semiconductor chip of the multi-chip stack package may be selectively enabled when a corresponding chip enablement signal is enabled. Each semiconductor chip may have at least one chip enablement pad to which the chip enablement signal is applied.

The multi-chip stack package may include a chip enablement option structure. The chip enablement option structure may be defined by an interconnection structure that electrically connects a package substrate to semiconductor chips stacked on the package substrate. Once the multi-chip stack packages are fabricated, however, it is difficult to modify or change the chip enablement option structures of the multi-chip stack packages.

SUMMARY

According to an embodiment, a semiconductor package may include a package substrate, first to four semiconductor chips, first chip enablement connectors, second chip enablement connectors, a chip enablement pad selection connector, and a chip selection auxiliary connector. The package substrate may include first chip enablement fingers, second chip enablement fingers, a chip enablement pad selection finger, and a chip selection auxiliary finger. The first chip enablement fingers may include first to fourth fingers, and the second chip enablement fingers may include first and second fingers. The first semiconductor chip may be disposed on the package substrate, and may have a first pad of first chip enablement pads, a first pad of second chip enablement pads, a first pad of chip enablement pad selection pads, and a first pad of chip selection auxiliary pads. The second semiconductor chip may be disposed on the first semiconductor chip, and may have a second pad of the first chip enablement pads, a second pad of the second chip enablement pads, a second pad of the chip enablement pad selection pads, and a second pad of the chip selection auxiliary pads. The third semiconductor chip may be disposed on the second semiconductor chip, and may have a third pad of the first chip enablement pads, a third pad of the second chip enablement pads, a third pad of the chip enablement pad selection pads, and a third pad of the chip selection auxiliary pads. The fourth semiconductor chip may be disposed on the third semiconductor chip, and may have a fourth pad of the first chip enablement pads, a fourth pad of the second chip enablement pads, a fourth pad of the chip enablement pad selection pads, and a fourth pad of the chip selection auxiliary pads. A first connector of the first chip enablement connectors may electrically connect the first finger of the first chip enablement fingers to the first pad of the first chip enablement pads. A second connector of the first chip enablement connectors may electrically connect the second finger of the first chip enablement fingers to the second pad of the first chip enablement pads. A third connector of the first chip enablement connectors may electrically connect the third finger of the first chip enablement fingers to the third pad of the first chip enablement pads. A fourth connector of the first chip enablement connectors may electrically connect the fourth finger of the first chip enablement fingers to the fourth pad of the first chip enablement pads. A first connector of the second chip enablement connectors may electrically connect both of the first and second pads of the second chip enablement pads to the first finger of the second chip enablement fingers. A second connector of the second chip enablement connectors may electrically connect both of the third and fourth pads of the second chip enablement pads to the second finger of the second chip enablement fingers. The chip enablement pad selection connector may electrically connect all of the first to fourth pads of the chip enablement pad selection pads to the chip enablement pad selection finger. The chip selection auxiliary connector may electrically connect both of the second and fourth pads of the chip selection auxiliary pads to the chip selection auxiliary finger. The first to fourth pads of the first chip enablement pads or the first to fourth pads of the second chip enablement pads may be optionally activated according to a signal applied to the chip enablement pad selection finger.

According to an embodiment, a semiconductor package may include a package substrate and semiconductor chips stacked on the package substrate. The package substrate may include at least one first chip enablement finger, at least one second chip enablement finger, and a chip enablement pad selection finger. Each of the semiconductor chips may include a first chip enablement pad connected to the at least one first chip enablement finger, a second chip enablement pad connected to the at least one second chip enablement finger, and a chip enablement pad selection pad connected to the chip enablement pad selection finger. The first chip enablement pads of the semiconductor chips or the second chip enablement pads of the semiconductor chips may be optionally activated by a signal applied to the chip enablement pad selection finger.

According to an embodiment, a semiconductor package may include four semiconductor chips and a package substrate on which the four semiconductor chips stacked. Each of the four semiconductor chips may include a first chip enablement pad, a second chip enablement pad, and a chip enablement pad selection pad. The package substrate may include first chip enablement fingers including first to fourth fingers and respectively connected to the first chip enablement pads of the four semiconductor chips, second chip enablement fingers having a first finger connected to the second chip enablement pads of a first pair of the four semiconductor chips and a second finger connected to the second chip enablement pads of a second pair of the four semiconductor chips, and a chip enablement pad selection finger connected to all of the chip enablement pad selection pads of the four semiconductor chips. The first chip enablement pads of the four semiconductor chips or the second chip enablement pads of the four semiconductor chips may be optionally activated by a signal applied to the chip enablement pad selection finger.

According to an embodiment, there is provided a memory card including a semiconductor package. The semiconductor package may include a package substrate, first to four semiconductor chips, first chip enablement connectors, second chip enablement connectors, a chip enablement pad selection connector, and a chip selection auxiliary connector. The package substrate may include first chip enablement fingers, second chip enablement fingers, a chip enablement pad selection finger, and a chip selection auxiliary finger. The first chip enablement fingers may include first to fourth fingers, and the second chip enablement fingers may include first and second fingers. The first semiconductor chip may be disposed on the package substrate, and may have a first pad of first chip enablement pads, a first pad of second chip enablement pads, a first pad of chip enablement pad selection pads, and a first pad of chip selection auxiliary pads. The second semiconductor chip may be disposed on the first semiconductor chip, and may have a second pad of the first chip enablement pads, a second pad of the second chip enablement pads, a second pad of the chip enablement pad selection pads, and a second pad of the chip selection auxiliary pads. The third semiconductor chip may be disposed on the second semiconductor chip, and may have a third pad of the first chip enablement pads, a third pad of the second chip enablement pads, a third pad of the chip enablement pad selection pads, and a third pad of the chip selection auxiliary pads. The fourth semiconductor chip may be disposed on the third semiconductor chip, and may have a fourth pad of the first chip enablement pads, a fourth pad of the second chip enablement pads, a fourth pad of the chip enablement pad selection pads, and a fourth pad of the chip selection auxiliary pads. A first connector of the first chip enablement connectors may electrically connect the first finger of the first chip enablement fingers to the first pad of the first chip enablement pads. A second connector of the first chip enablement connectors may electrically connect the second finger of the first chip enablement fingers to the second pad of the first chip enablement pads. A third connector of the first chip enablement connectors may electrically connect the third finger of the first chip enablement fingers to the third pad of the first chip enablement pads. A fourth connector of the first chip enablement connectors may electrically connect the fourth finger of the first chip enablement fingers to the fourth pad of the first chip enablement pads. A first connector of the second chip enablement connectors may electrically connect both of the first and second pads of the second chip enablement pads to the first finger of the second chip enablement fingers. A second connector of the second chip enablement connectors may electrically connect both of the third and fourth pads of the second chip enablement pads to the second finger of the second chip enablement fingers. The chip enablement pad selection connector may electrically connect all of the first to fourth pads of the chip enablement pad selection pads to the chip enablement pad selection finger. The chip selection auxiliary connector may electrically connect both of the second and fourth pads of the chip selection auxiliary pads to the chip selection auxiliary finger. The first to fourth pads of the first chip enablement pads or the first to fourth pads of the second chip enablement pads may be optionally activated according to a signal applied to the chip enablement pad selection finger.

According to an embodiment, there is provided a memory card including a semiconductor package. The semiconductor package may include a package substrate and semiconductor chips stacked on the package substrate. The package substrate may include at least one first chip enablement finger, at least one second chip enablement finger, and a chip enablement pad selection finger. Each of the semiconductor chips may include a first chip enablement pad connected to the at least one first chip enablement finger, a second chip enablement pad connected to the at least one second chip enablement finger, and a chip enablement pad selection pad connected to the chip enablement pad selection finger. The first chip enablement pads of the semiconductor chips or the second chip enablement pads of the semiconductor chips may be optionally activated by a signal applied to the chip enablement pad selection finger.

According to an embodiment, there is provided a memory card including a semiconductor package. The semiconductor package may include four semiconductor chips and a package substrate on which the four semiconductor chips stacked. Each of the four semiconductor chips may include a first chip enablement pad, a second chip enablement pad, and a chip enablement pad selection pad. The package substrate may include first chip enablement fingers including first to fourth fingers and respectively connected to the first chip enablement pads of the four semiconductor chips, second chip enablement fingers having a first finger connected to the second chip enablement pads of a first pair of the four semiconductor chips and a second finger connected to the second chip enablement pads of a second pair of the four semiconductor chips, and a chip enablement pad selection finger connected to all of the chip enablement pad selection pads of the four semiconductor chips. The first chip enablement pads of the four semiconductor chips or the second chip enablement pads of the four semiconductor chips may be optionally activated by a signal applied to the chip enablement pad selection finger.

According to an embodiment, there is provided an electronic system including a semiconductor package. The semiconductor package may include a package substrate, first to four semiconductor chips, first chip enablement connectors, second chip enablement connectors, a chip enablement pad selection connector, and a chip selection auxiliary connector. The package substrate may include first chip enablement fingers, second chip enablement fingers, a chip enablement pad selection finger, and a chip selection auxiliary finger. The first chip enablement fingers may include first to fourth fingers, and the second chip enablement fingers may include first and second fingers. The first semiconductor chip may be disposed on the package substrate, and may have a first pad of first chip enablement pads, a first pad of second chip enablement pads, a first pad of chip enablement pad selection pads, and a first pad of chip selection auxiliary pads. The second semiconductor chip may be disposed on the first semiconductor chip, and may have a second pad of the first chip enablement pads, a second pad of the second chip enablement pads, a second pad of the chip enablement pad selection pads, and a second pad of the chip selection auxiliary pads. The third semiconductor chip may be disposed on the second semiconductor chip, and may have a third pad of the first chip enablement pads, a third pad of the second chip enablement pads, a third pad of the chip enablement pad selection pads, and a third pad of the chip selection auxiliary pads. The fourth semiconductor chip may be disposed on the third semiconductor chip, and may have a fourth pad of the first chip enablement pads, a fourth pad of the second chip enablement pads, a fourth pad of the chip enablement pad selection pads, and a fourth pad of the chip selection auxiliary pads. A first connector of the first chip enablement connectors may electrically connect the first finger of the first chip enablement fingers to the first pad of the first chip enablement pads. A second connector of the first chip enablement connectors may electrically connect the second finger of the first chip enablement fingers to the second pad of the first chip enablement pads. A third connector of the first chip enablement connectors may electrically connect the third finger of the first chip enablement fingers to the third pad of the first chip enablement pads. A fourth connector of the first chip enablement connectors may electrically connect the fourth finger of the first chip enablement fingers to the fourth pad of the first chip enablement pads. A first connector of the second chip enablement connectors may electrically connect both of the first and second pads of the second chip enablement pads to the first finger of the second chip enablement fingers. A second connector of the second chip enablement connectors may electrically connect both of the third and fourth pads of the second chip enablement pads to the second finger of the second chip enablement fingers. The chip enablement pad selection connector may electrically connect all of the first to fourth pads of the chip enablement pad selection pads to the chip enablement pad selection finger. The chip selection auxiliary connector may electrically connect both of the second and fourth pads of the chip selection auxiliary pads to the chip selection auxiliary finger. The first to fourth pads of the first chip enablement pads or the first to fourth pads of the second chip enablement pads may be optionally activated according to a signal applied to the chip enablement pad selection finger.

According to an embodiment, there is provided an electronic system including a semiconductor package. The semiconductor package may include a package substrate and semiconductor chips stacked on the package substrate. The package substrate may include at least one first chip enablement finger, at least one second chip enablement finger, and a chip enablement pad selection finger. Each of the semiconductor chips may include a first chip enablement pad connected to the at least one first chip enablement finger, a second chip enablement pad connected to the at least one second chip enablement finger, and a chip enablement pad selection pad connected to the chip enablement pad selection finger. The first chip enablement pads of the semiconductor chips or the second chip enablement pads of the semiconductor chips may be optionally activated by a signal applied to the chip enablement pad selection finger.

According to an embodiment, there is provided an electronic system including a semiconductor package. The semiconductor package may include four semiconductor chips and a package substrate on which the four semiconductor chips stacked. Each of the four semiconductor chips may include a first chip enablement pad, a second chip enablement pad, and a chip enablement pad selection pad. The package substrate may include first chip enablement fingers including first to fourth fingers and respectively connected to the first chip enablement pads of the four semiconductor chips, second chip enablement fingers having a first finger connected to the second chip enablement pads of a first pair of the four semiconductor chips and a second finger connected to the second chip enablement pads of a second pair of the four semiconductor chips, and a chip enablement pad selection finger connected to all of the chip enablement pad selection pads of the four semiconductor chips. The first chip enablement pads of the four semiconductor chips or the second chip enablement pads of the four semiconductor chips may be optionally activated by a signal applied to the chip enablement pad selection finger.

BRIEF DESCRIPTION OF THE DRAWINGS

Various embodiments of the present disclosure will become more apparent in view of the attached drawings and accompanying detailed description, in which.

DETAILED DESCRIPTION

Figure 1:
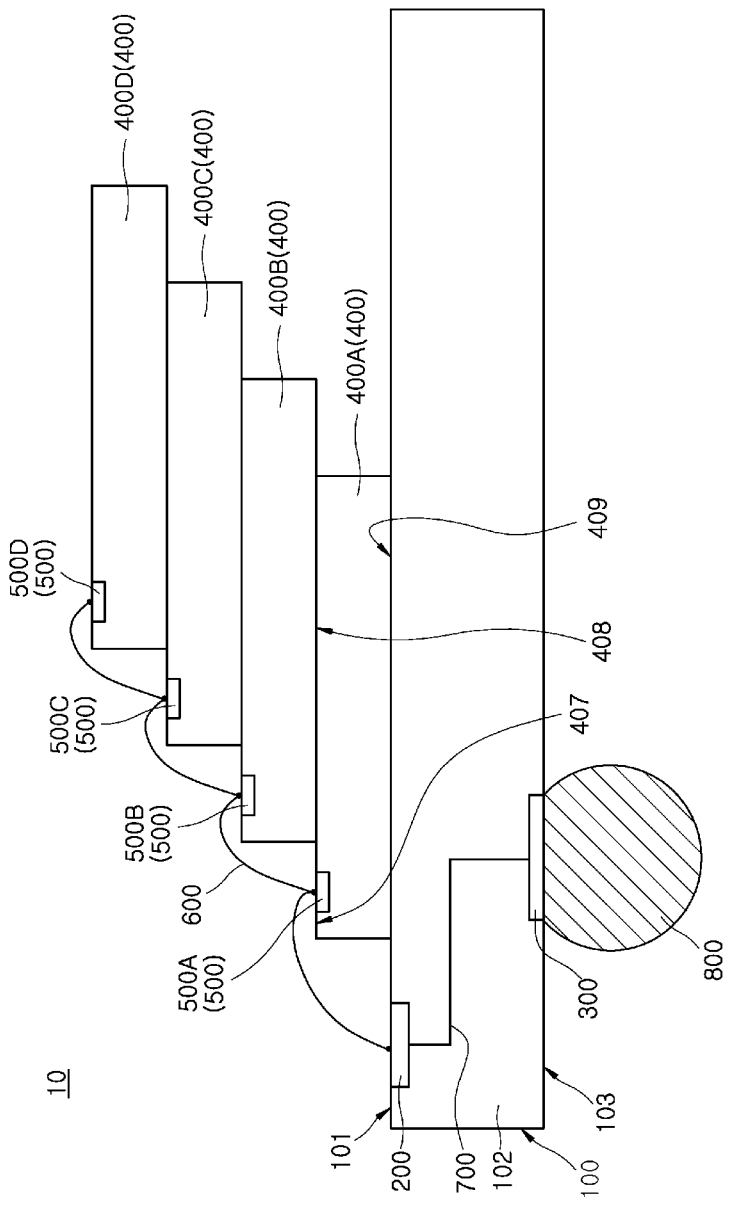
FIG. 1 is a cross-sectional view illustrating an example of a stack structure of a semiconductor package according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms first, second, third etc. may be used herein to describe various elements, these elements should not be limited by these terms. These terms are only used to distinguish one element from another element, but not used to define only the element itself or to mean a particular sequence. In addition, when an element is referred to as being located "on," "over," "above," "under" or "beneath" another element, it is intended to mean relative position relationship, but not used to limit certain cases that the element directly contacts the other element, or at least one intervening element is present therebetween. Accordingly, the terms such as "on," "over," "above," "under," "beneath," "below" and the like that are used herein are for the purpose of describing particular embodiments only and are not intended to limit the scope of the present disclosure.

A semiconductor package may include electronic devices such as semiconductor chips. The semiconductor chips may be obtained by separating a semiconductor substrate such as a wafer into a plurality of pieces using a die sawing process. The semiconductor chips may correspond to memory chips, logic chips (including application specific integrated circuits [ASIC] chips), or system-on-chips (SoC). The memory chips may include dynamic random access memory (DRAM) circuits, static random access memory (SRAM) circuits, flash circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

Same reference numerals refer to same elements throughout the specification. Thus, even though a reference numeral is not mentioned or described with reference to a drawing, the reference numeral may be mentioned or described with reference to another drawing. In addition, even though a reference numeral is not shown in a drawing, it may be mentioned or described with reference to another drawing.

The present disclosure may provide semiconductor packages, each of which is capable of selectively activating at least one specific chip enablement pad of chip enablement pads of semiconductor chips included therein by using a chip enablement option structure of a package substrate included therein.

FIG. 1 is a cross-sectional view illustrating an example of a stack structure of a semiconductor package 10 according to an embodiment. Referring to FIG. 1, the semiconductor package 10 may include a package substrate 100 and a plurality of semiconductor chips 400 stacked on the package substrate 100 to have a multi chip stack structure. Although FIG. 1 illustrates an example that stacks a total of four layers of the semiconductor chips 400 on the package substrate 100, the present disclosure is not limited thereto. Therefore, the number of semiconductor chips 400 stacked in a vertical configuration may vary. For example, in some embodiments, the semiconductor package 10 may stack a total of eight (or sixteen, thirty two, etc) semiconductor chips 400. At least one of the semiconductor chips 400 may be a NAND-type flash memory chip. For example, each of the semiconductor chips 400 may be a NAND-type flash memory chip. Since the semiconductor chips 400 are stacked on the package substrate 100, the semiconductor package 10 may have a large data storage capacity.

The package substrate 100 may be a printed circuit board (PCB). The package substrate 100 may transmit various electrical control/command signals and/or electrical data signals received from an external device (not illustrated) to the semiconductor chips 400. The package substrate 100 may also transmit the various electrical control/command signals and/or electrical data signals output from the semiconductor chips 400 to the external device. The package substrate 100 may include an interconnection structure that electrically or signally connects the semiconductor chips 400 to the external device. The package substrate 100 may also include a substrate body 102 having an electrical insulation property. The substrate body 102 may include a dielectric material such as epoxy resin or may include a resin material in which glassy fabric is embedded.

Trace patterns may be disposed on both opposite surfaces (first and second surfaces 101 and 103) of the substrate body 102. Connection fingers (bonding fingers) 200, which may be used as a form of the trace patterns, may be disposed on the first surface 101 of the substrate body 102. Connection land pads 300, for example, ball land pads, which may be used as the trace patterns, may be disposed on the second surface 103 of the substrate body 102. Outer connection terminals 800 may be disposed on the connection land pads 300 to electrically connect the package substrate 100 to the external device. The outer connection terminals 800 may be solder balls.

The connection fingers 200 and the connection land pads 300 may be conductive members having electrical connectors attached thereto. Routing portions 700 corresponding to interconnect portions may be disposed in the substrate body 102 to electrically connect the connection fingers 200 to the connection land pads 300. The connection fingers 200, the connection land pads 300 and the routing portions 700 may constitute the interconnection structure of the package substrate 100.

The semiconductor chips 400 may be stacked on the first surface 101 of the package substrate 100 to provide a step structure. That is, the upper semiconductor chip 400 may be stacked on the lower semiconductor chip 400 in a laterally offset arrangement so that connection pads 500 disposed on a first surface 408 of the lower semiconductor chip 400 are exposed. The first semiconductor chip 400A may be stacked on the first surface 101 of the package substrate 100 so that a second surface 409 of the first semiconductor chip 400A faces the first surface 101 of the package substrate 100, and the second semiconductor chip 400B may be stacked on the first semiconductor chip 400A in a laterally offset arrangement so that the connection pads 500A of the first semiconductor chip 400A are exposed. The third semiconductor chip 400C and the fourth semiconductor chip 400D may be sequentially stacked on the second semiconductor chip 400B to provide the step structure. The semiconductor chips 400 may be stacked in a laterally offset arrangement so that all of the connection pads 500B of the second semiconductor chip 400B, the connection pads 500C of the third semiconductor chip 400C and the connection pads 500D of the fourth semiconductor chip 400D are exposed. In some embodiments, the semiconductor chips 400 may be vertically stacked on the package substrate 100.

Connectors 600 may be provided to electrically or signally connect the semiconductor chips 400 to the package substrate 100. Although FIG. 1 illustrates an example in which the connectors 600 are bonding wires, the present disclosure is not limited thereto. For example, various connectors other than bonding wires may be used to electrically connect the semiconductor chips 400 to the package substrate 100. In some embodiments, conductive lines or conductive members may be used as the connectors 600 that electrically connect the connection pads 500 of the semiconductor chips 400 to the connection fingers 200 of the package substrate 100. The connectors 600 may also electrically connect the lower semiconductor chip (e.g., 400A) to the upper semiconductor chip (e.g., 400B) stacked on the lower semiconductor chip (e.g., 400A).

Each connection finger 200 may be electrically connected to one of the connection pads 500 of the first semiconductor chip 400A, one of the connection pads 500 of the second semiconductor chip 400B, one of the connection pads 500 of the third semiconductor chip 400C, and one of the connection pads 500 of the fourth semiconductor chip 400D, through four of the connectors 600. Thus, if the first to fourth semiconductor chips 400 simultaneously operate, four different signals output from four different connection pads 500 of the first to fourth semiconductor chips 400A, 400B, 400C and 400D may be simultaneously transmitted to one of the connection fingers 200 or vice versa. In such a case, the semiconductor package 10 may malfunction. Thus, it may be necessary to select one of the semiconductor chips 400 to prevent the semiconductor package 10 from abnormally operating. In order to select any one of the semiconductor chips 400, it may be necessary that each of the semiconductor chips 400 has at least one chip enablement pad to which a chip enablement signal is selectively applied.

Figure 2:
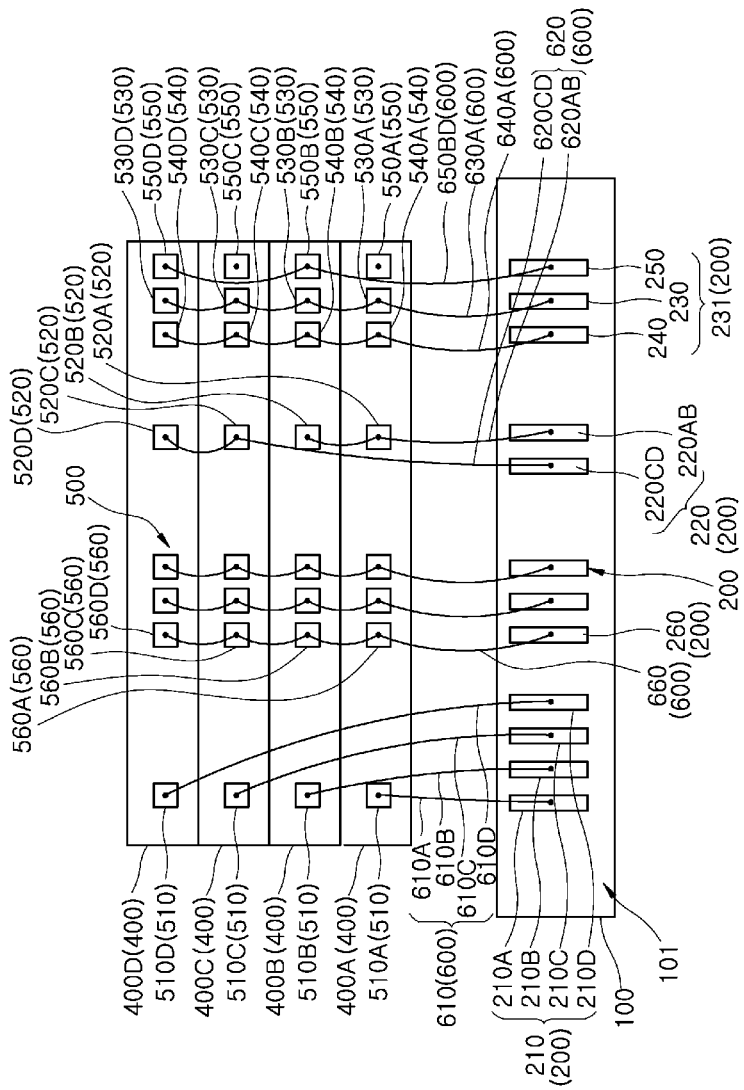
FIG. 2 is a diagram illustrating an example of a chip enablement pad structure of a semiconductor package according to an embodiment.
Figure 3:
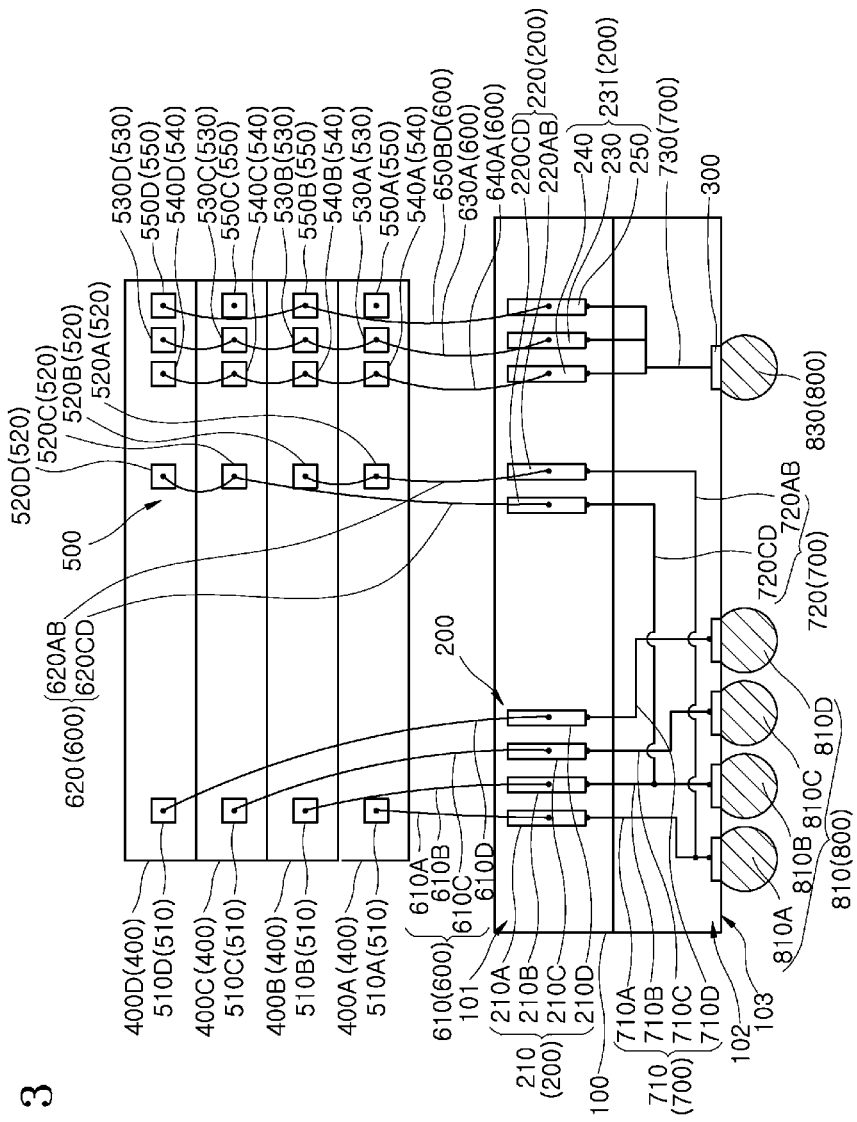
FIG. 3 is a diagram illustrating an example of a chip enablement pad structure of a semiconductor package according to an embodiment.

FIGS. 2 and 3 are diagrams illustrating examples of the chip enablement pad structure of the semiconductor package 10 illustrated in FIG. 1.

Referring to FIG. 2, each of the semiconductor chips 400 stacked on the first surface 101 of the package substrate 100 may include a first chip enablement pad 510 and a second chip enablement pad 520 that may be used as the connection pads (500 of FIG. 1). The first chip enablement pad 510 and the second chip enablement pad 520 may be terminals to which chip enablement signals for selecting certain semiconductor chips 400 may be applied. The first chip enablement pad 510 and the second chip enablement pad 520 may be used in two different chip selection modes, respectively. For example, if there are two different chip selection modes (e.g., first and second chip selection modes) for selecting a certain semiconductor chip 400, the first chip enablement pad 510 may be used in a first chip selection mode, and the second chip enablement pad 520 may be used in a second chip selection mode. When the semiconductor package 10 operates in one mode selected between the two different chip selection modes, the first chip enablement pads 510 of the semiconductor chips 400 may be activated while the second chip enablement pads 520 of the semiconductor chips 400 are deactivated, or the second chip enablement pads 520 of the semiconductor chips 400 may be activated while the first chip enablement pads 510 of the semiconductor chips 400 are deactivated.

Some of the connection pads 500 of each semiconductor chip 400 may act as data signal pads (DQ pads) 560 to which data signals are applied or through which the data signals are read out. If each of the semiconductor chips 400 is designed to have a bit organization of "x8," the data signal pads 560 of each semiconductor chip 400 may include eight data pads that correspond to first to eighth data pads DQ0, DQ1, DQ2, DQ3, DQ4, DQ5, DQ6, and DQ7 (not illustrated), respectively.

In order to activate one of the first and second chip enablement modes, it may be necessary to select and activate the first chip enablement pads 510 or the second chip enablement pads 520. A chip enablement pad selection signal may be applied to the semiconductor chip 400 to activate a certain chip enablement pad. Each of the semiconductor chips 400 may include a chip enablement pad selection pad 530 to which the chip enablement pad selection signal is applied.

The first chip enablement pads 510 may be activated (enabled) to activate a first chip selection mode according to the chip enablement pad selection signal. In such a case, the second chip enablement pads 520 may be deactivated (disabled). On the contrary, the second chip enablement pads 520 may be activated (enabled) to activate a second chip selection mode according to the chip enablement pad selection signal. In such a case, the first chip enablement pads 510 may be deactivated (disabled). That is, the semiconductor package 10 may operate in the first chip selection mode or in the second chip selection mode according to a logic level of the chip enablement pad selection signal. Thus, it may be possible to control (or change) the chip selection mode of the semiconductor package 10 by applying the chip enablement pad selection signal to the chip enablement pad selection pads 530 of the semiconductor chips 400. Each of the semiconductor chips 400 may further include a first chip selection auxiliary pad 540 and a second chip selection auxiliary pad 550 to perform a more specific chip selection operation when the semiconductor chips 400 operate, for example, in the second chip selection mode. For example, a first control signal (e.g., SD_SEL signal) may be applied to the first chip selection auxiliary pad 540, and a second control signal (e.g., front/back [FB] signal) may be applied to the second chip selection auxiliary pad 550. Here, the first control signal (e.g. SD_SEL signal) may be a signal indicating that the semiconductor package 10 is configured to have dual die package (DDP) structures. In such a case, two of the semiconductor chips 400 may constitute a dual die package (DDP) structure, and the second chip enablement pads 520 of the pair of semiconductor chips 400 constituting each dual die package (DDP) structure may be connected to each other, as illustrated in FIG. 2. The second control signal (e.g., front/back [FB] signal) may be a signal indicating that one of the pair of semiconductor chips 400 constituting each dual die package (DDP) structure is a first chip and the other of the pair of semiconductor chips 400 is a second chip when the semiconductor package 10 has the dual die package (DDP) structures. When the semiconductor chips 400 are selected to operate in the second chip selection mode, one of the semiconductor chips 400 may be selected according to a combination of signals applied to the second chip enablement pads 520, the first chip selection auxiliary pads 540, and the second chip selection auxiliary pads 550.

The package substrate 100 may further include data signal fingers 260 disposed on the first surface 101 of the substrate body 102 and connected to the data signal pads 560. Here, the data signal fingers 260 may correspond to some of the connection fingers 200. The data signal fingers 260 may be electrically or signally connected to the data signal pads 560 through data connectors 660 corresponding to some of the connectors 600. The first data signal pads 560A of the first semiconductor chip 400A may be connected to the second data signal pads 560B of the second semiconductor chip 400B through some of the data connectors 660, and the second data signal pads 560B of the second semiconductor chip 400B may also be connected to the third data signal pads 560C of the third semiconductor chip 400C through some of the data connectors 660. Moreover, the third data signal pads 560C of the third semiconductor chip 400C may also be connected to the fourth data signal pads 560D of the fourth semiconductor chip 400D through some of the data connectors 660. Since only one of the semiconductor chips 400 is selected by a chip selection mode such as the first chip selection mode or the second chip selection mode, only the data signals of the selected semiconductor chip 400 may be output through the data signal fingers 260.

The package substrate 100 may further include first chip enablement fingers 210 disposed on the first surface 101 of the substrate body 102 and connected to the first chip enablement pads 510 of the semiconductor chips 400. Here, the first chip enablement fingers 210 may correspond to some of the connection fingers 200. The number of the first chip enablement fingers 210 may be two or more. For example, the number of the first chip enablement fingers 210 may be equal to the number of the semiconductor chips 400. If the number of the semiconductor chips 400 is four, the number of the first chip enablement fingers 210 may also be four. If the semiconductor package 10 has an octa-die package (ODP) structure including eight semiconductor chips, the number of the first chip enablement fingers 210 may be eight. The first chip enablement fingers 210 may be electrically or signally connected to the first chip enablement pads 510 of the semiconductor chips 400 through first chip enablement connectors 610 corresponding to some of the connectors 600.

A first pad 510A of the first chip enablement pads 510, which is disposed on the first semiconductor chip 400A, may be connected to a first finger 210A of the first chip enablement fingers 210 through a first connector 610A of the first chip enablement connectors 610. A second pad 510B of the first chip enablement pads 510, which is disposed on the second semiconductor chip 400B, may be connected to a second finger 210B of the first chip enablement fingers 210 through a second connector 610B of the first chip enablement connectors 610. A third pad 510C of the first chip enablement pads 510, which is disposed on the third semiconductor chip 400C, may be connected to a third finger 210C of the first chip enablement fingers 210 through a third connector 610C of the first chip enablement connectors 610. A fourth pad 510D of the first chip enablement pads 510, which is disposed on the fourth semiconductor chip 400D, may be connected to a fourth finger 210D of the first chip enablement fingers 210 through a fourth connector 610D of the first chip enablement connectors 610. Examples of the first to fourth connectors 610A, 610B, 610C and 610D of the first chip enablement connectors 610 may be bonding wires.

The first to fourth fingers 210A, 210B, 210C and 210D of the first chip enablement fingers 210 may be connected to the first to fourth pads 510A, 510B, 501C and 510D of the first chip enablement pads 510 through the first to fourth connectors 610A, 610B, 610C and 610D of the first chip enablement connectors 610, respectively. The first chip enablement pads 510 may be activated according to the chip enablement pad selection signal applied to the chip enablement pad selection pads 530 of the semiconductor chips 400. In such a case, the second chip enablement pads 520 may be deactivated. If the first chip enablement pads 510 are activated while the second chip enablement pads 520 are deactivated, the semiconductor chips 400 may operate in the first chip selection mode. In the first chip selection mode, the semiconductor chips 400 may be individually selected. In the first chip selection mode, any one of the first to fourth semiconductor chips 400A, 400B, 400C and 400D may be selected by using the first chip enablement pads 510A, 510B, 510C and 510D which are distinguishable from each other. The first chip selection mode may be an operation mode that selects one of four stacked semiconductor chips constituting a quad-die package (QDP) structure by using four chip enablement signals. That is, the semiconductor chips 400 illustrated in FIG. 2 may constitute the quad-die package (QDP) structure with four chip enablement signals.

The package substrate 100 may further include second chip enablement fingers 220 disposed on the first surface 101 of the substrate body 102 and connected to the second chip enablement pads 520 of the semiconductor chips 400. Here, the second chip enablement fingers 220 may correspond to some of the connection fingers 200. The number of the second chip enablement fingers 220 may be two or more. The number of the second chip enablement fingers 220 may be half of the number of the semiconductor chips 400 stacked on the package substrate 100. If the number of the semiconductor chips 400 is four, the number of the second chip enablement fingers 220 may be two. If the number of the semiconductor chips 400 is eight, the number of the second chip enablement fingers 220 may be four.

The second chip enablement fingers 220 may be electrically or signally connected to the second chip enablement pads 520 of the semiconductor chips 400 through second chip enablement connectors 620 corresponding to some of the connectors 600. A first pad 520A of the second chip enablement pads 520, which is disposed on the first semiconductor chip 400A, may be connected to a first finger 220AB of the second chip enablement fingers 220 through a first connector 620AB of the second chip enablement connectors 620. The first connector 620AB of the second chip enablement connectors 620 may extend to electrically connect the first pad 520A of the second chip enablement pads 520 to a second pad 520B of the second chip enablement pads 520, which is disposed on the second semiconductor chip 400B. Thus, the first finger 220AB of the second chip enablement fingers 220 may be connected to both of the first and second pads 520A and 520B of the second chip enablement pads 520 disposed on the first and second semiconductor chips 400A and 400B, respectively, through the first connector 620AB of the second chip enablement connectors 620. The first connector 620AB of the second chip enablement connectors 620 may be a bonding wire.

A third pad 520C of the second chip enablement pads 520, which is disposed on the third semiconductor chip 400C, may be connected to a second finger 220CD of the second chip enablement fingers 220 through a second connector 620CD of the second chip enablement connectors 620. The second connector 620CD of the second chip enablement connectors 620 may extend to electrically connect the third pad 520C of the second chip enablement pads 520 to a fourth pad 520D of the second chip enablement pads 520, which is disposed on the fourth semiconductor chip 400D. Thus, the second finger 220CD of the second chip enablement fingers 220 may be connected to both of the third and fourth pads 520C and 520D of the second chip enablement pads 520 disposed on the third and fourth semiconductor chips 400C and 400D, respectively, through the second connector 620CD of the second chip enablement connectors 620. The second connector 620CD of the second chip enablement connectors 620 may be a bonding wire.

The package substrate 100 may further include a chip enablement pad selection finger 230 disposed on the first surface 101 of the substrate body 102 and connected to the chip enablement pad selection pads 530 of the semiconductor chips 400. Here, the chip enablement pad selection finger 230 may correspond to one of the connection fingers 200. The chip enablement pad selection finger 230 may be electrically and signally connected to the chip enablement pad selection pads 530 of the semiconductor chips 400 through a chip enablement pad selection connector 630A corresponding to one of the connectors 600. A first pad 530A of the chip enablement pad selection pads 530, which is disposed on the first semiconductor chip 400A, may be connected to the chip enablement pad selection finger 230 of the package substrate 100 through the chip enablement pad selection connector 630A. The chip enablement pad selection connector 630A may be a bonding wire.

The chip enablement pad selection connector 630A may extend to connect the first pad 530A of the chip enablement pad selection pads 530 to a second pad 530B of the chip enablement pad selection pads 530, which is disposed on the second semiconductor chip 400B, a third pad 530C of the chip enablement pad selection pads 530, which is disposed on the third semiconductor chip 400C, and a fourth pad 530D of the chip enablement pad selection pads 530, which is disposed on the fourth semiconductor chip 400D. That is, the chip enablement pad selection finger 230 of the package substrate 100 may be connected to all of the chip enablement pad selection pads 530A, 530B, 530C and 530D of the semiconductor chips 400A, 400B, 400C and 400D through the chip enablement pad selection connector 630A. The first chip enablement pads 510 or the second chip enablement pads 520 may be selectively activated according to the chip enablement pad selection signal applied to the chip enablement pad selection finger 230.

The package substrate 100 may further include a first chip selection auxiliary finger 240 disposed on the first surface 101 of the substrate body 102 and connected to the first chip selection auxiliary pads 540 of the semiconductor chips 400, and the first chip selection auxiliary finger 240 may correspond to one of the connection fingers 200. The first chip selection auxiliary finger 240 may be electrically and signally connected to the first chip selection auxiliary pads 540 of the semiconductor chips 400 through a first chip selection auxiliary connector 640A corresponding to one of the connectors 600. A first pad 540A of the first chip selection auxiliary pads 540, which is disposed on the first semiconductor chip 400A, may be directly connected to the first chip selection auxiliary finger 240 of the package substrate 100 through the first chip selection auxiliary connector 640A. The first chip selection auxiliary connector 640A may be a bonding wire.

The first chip selection auxiliary connector 640A may extend to connect the first pad 540A of the first chip selection auxiliary pads 540 to a second pad 540B of the first chip selection auxiliary pads 540, which is disposed on the second semiconductor chip 400B, a third pad 540C of the first chip selection auxiliary pads 540, which is disposed on the third semiconductor chip 400C, and a fourth pad 540D of the first chip selection auxiliary pads 540, which is disposed on the fourth semiconductor chip 400D. That is, the first chip selection auxiliary finger 240 of the package substrate 100 may be connected to all of the first chip selection auxiliary pads 540A, 540B, 540C and 540D of the semiconductor chips 400A, 400B, 400C and 400D through the first chip selection auxiliary connector 640A. The first control signal (e.g., SD_SEL signal) applied to the first chip selection auxiliary finger 240 may be a signal indicating that all of the semiconductor chips 400A, 400B, 400C and 400D of the semiconductor package 10 have a two-chip-enablement-signal, dual-die-package (2CE DDP) structure. For example, if the first control signal (e.g., SD_SEL signal) is input to the first chip selection auxiliary finger 240 of the semiconductor package 10, the first and second semiconductor chips 400A and 400B may be recognized as one logic die and the third and fourth semiconductor chips 400C and 400D may be recognized as the other logic die.

The package substrate 100 may further include a second chip selection auxiliary finger 250 disposed on the first surface 101 of the substrate body 102 and connected to the second chip selection auxiliary pads 550 of the semiconductor chips 400. Here, the second chip selection auxiliary finger 250 may correspond to one of the connection fingers 200. The second chip selection auxiliary finger 250, the first chip selection auxiliary finger 240, and the chip enablement pad selection finger 230 may correspond to control fingers 231. The second chip selection auxiliary finger 250 and the first chip selection auxiliary finger 240 may be disposed to be adjacent to the chip enablement pad selection finger 230.

The second chip selection auxiliary finger 250 may be electrically and signally connected to the second chip selection auxiliary pads 550 of the semiconductor chips 400 through a second chip selection auxiliary connector 650BD corresponding to one of the connectors 600. A second pad 550B of the second chip selection auxiliary pads 550, which is disposed on the second semiconductor chip 400B, may be connected to the second chip selection auxiliary finger 250 of the package substrate 100 through the second chip selection auxiliary connector 650BD. The second chip selection auxiliary connector 650BD may be a bonding wire.

The second chip selection auxiliary connector 650BD may extend to connect the second pad 550B of the second chip selection auxiliary pads 550 to a fourth pad 550D of the second chip selection auxiliary pads 550, which is disposed on the fourth semiconductor chip 400D. That is, the second chip selection auxiliary finger 250 of the package substrate 100 may be connected to both of the second and fourth chip selection auxiliary pads 550B and 550D of the second and fourth semiconductor chips 400B and 400D through the second chip selection auxiliary connector 650BD. A first pad 550A of the second chip selection auxiliary pads 550, which is disposed on the first semiconductor chip 400A between the package substrate 100 and the second semiconductor chip 400B, may not be connected to the second chip selection auxiliary connector 650BD. As a result, the first pad 550A of the second chip selection auxiliary pads 550 may be floating. In addition, a third pad 550C of the second chip selection auxiliary pads 550, which is disposed on the third semiconductor chip 400C between the second semiconductor chip 400B and the fourth semiconductor chip 400D, may not be connected to the second chip selection auxiliary connector 650BD to have a floating status.

In some embodiments, the second chip selection auxiliary connector 650BD extending from the second chip selection auxiliary finger 250 may be disposed to connect the first pad 550A of the second chip selection auxiliary pads 550 to the third pad 550C of the second chip selection auxiliary pads 550. In such a case, the second and fourth pads 550B and 550D of the second chip selection auxiliary pads 550 may not be connected to the second chip selection auxiliary connector 650BD. As a result, the second and fourth pads 550B and 550D of the second chip selection auxiliary pads 550 may be floating.

The chip enablement pad selection finger 230 may be connected to the chip enablement pad selection pads 530 through the chip enablement pad selection connector 630A. If the second chip enablement pads 520 are activated by applying the chip enablement pad signal to the chip enablement pad selection pads 530 through the chip enablement pad selection finger 230, the first and second semiconductor chips 400A and 400B connected to the first finger 220AB may be distinguished from the third and fourth semiconductor chips 400C and 400D connected to the second finger 220CD. In such a case, sine both of the first and second pads 520A and 520B disposed on the first and second semiconductor chips 400A and 400B are connected to the first finger 220AB of the second chip enablement fingers 220, distinguishing the first semiconductor chip 400A (or the second semiconductor chip 400B) from the second semiconductor chip 400B (or the first semiconductor chip 400A) may be additionally required to select any one of the first and second semiconductor chips 400A and 400B.

Any one of the first and second semiconductor chips 400A and 400B may be selected by using a connection structure between the second chip selection auxiliary finger 250 and the second pad 550B of the second chip selection auxiliary pads 550. That is, the first pad 550A of the second chip selection auxiliary pads 550, which is disposed on the first semiconductor chip 400A, may not be connected to the second chip selection auxiliary connector 650BD, and may be floating. However, the second pad 550B of the second chip selection auxiliary pads 550, which is disposed on the second semiconductor chip 400B, may be connected to the second chip selection auxiliary connector 650BD. Thus, if the second control signal (e.g., front/back [FB] signal)

having a logic "high" level corresponding to a power supply voltage VCC is applied to the second chip selection auxiliary finger 250, the second semiconductor chip 400B may be recognized as a second chip of the dual die package (DDP) structure comprised of the first and second semiconductor chips 400A and 400B because the second pad 550B of the second chip selection auxiliary pads 550 has a logic "high" level. In such a case, the first semiconductor chip 400A may be recognized as a first chip of the DDP structure comprised of the first and second semiconductor chips 400A and 400B because the first pad 550A of the second chip selection auxiliary pads 550 are floating.

As described above, a second chip selection mode is a chip selection mode that selects one of the semiconductor chips 400A, 400B, 400C and 400D using two chip enablement signals, and the second chip selection mode may be realized using a connection structure of the second chip selection auxiliary connector 650BD, which connects the second chip selection auxiliary finger 250 to the second pad 550B of the second chip selection auxiliary pads 550 and the fourth pad 550D of the second chip selection auxiliary pads 550, and using a connection structure of the first connector 620AB of the second chip enablement connectors 620, which connects the first finger 220AB of the second chip enablement fingers 220 to the first and second pads 520A and 520B of the second chip enablement pads 520, and using a connection structure of the second connector 620CD of the second chip enablement connectors 620, which connects the second finger 220CD of the second chip enablement fingers 220 to the third and fourth pads 520C and 520D of the second chip enablement pads 520. Thus, the semiconductor package 10 may operate, for example, in a two-chip-enablement-signal, quad-die-package (2CE_QDP) mode.

Furthermore, a chip enablement option structure, which is capable of changing the chip enablement pads and the chip selection mode, may also be realized using an array structure of the connection fingers 200 of the package substrate 100 disposed to realize the first and second selection modes as well as using a connection structure of the connectors 600 electrically connecting the package substrate 100 to the semiconductor chips 400. Thus, an operation mode or a chip enablement mode of the semiconductor package 10 may be changed even after the semiconductor package 10 is fabricated.

Referring to FIG. 3, the connection fingers 200 may be disposed on the first surface 101 of the substrate body 102, and the connection land pads 300 may be disposed on the second surface 103 of the substrate body 102. In addition, the outer connection terminals 800 may be disposed on the connection land pads 300 to electrically connect the package substrate 100 to an external device. In FIG. 3, the data signal pads 560 and the data signal fingers 260 illustrated in FIG. 2 are omitted. Chip enablement connection terminals 810 may be disposed on some of the connection land pads 300. The chip enablement connection terminals 810 may be electrically or signally connected to the first chip enablement fingers 210 through first chip enablement routing portions 710, respectively. The first chip enablement routing portions 710 may be disposed to substantially penetrate the substrate body 102 of the package substrate 100.

The first chip enablement routing portions 710 penetrating the substrate body 102 may include first to fourth routing portions 710A, 710B, 710C and 710D, which electrically or signally connect the first to fourth fingers 210A, 210B, 210C and 210D of the first chip enablement fingers 210 to first to fourth connection terminals 810A, 810B, 810C and 810D of the chip enablement connection terminals 810, respectively.

The second chip enablement fingers 220 may be connected to the first chip enablement routing portions 710 through second chip enablement routing portions 720 so that the second chip enablement fingers 220 are connected to the chip enablement connection terminals 810. In order to connect the first finger 220AB of the second chip enablement fingers 220 to the first connection terminal 810A of the chip enablement connection terminals 810, a first routing portion 720AB of the second chip enablement routing portions 720 may be disposed in the package substrate 100 to electrically connect the first finger 220AB of the second chip enablement fingers 220 to the first routing portion 710A of the first chip enablement routing portions 710. In order to connect the second finger 220CD of the second chip enablement fingers 220 to the second connection terminal 810B of the chip enablement connection terminals 810, a second routing portion 720CD of the second chip enablement routing portions 720 may be disposed in the package substrate 100 to electrically connect the second finger 220CD of the second chip enablement fingers 220 to the second routing portion 710B of the first chip enablement routing portions 710. The second chip enablement routing portions 720 may be disposed in the substrate body 102 of the package substrate 100. In some embodiments, the second chip enablement routing portions 720 may be disposed on the first surface 101 of the substrate body 102. As a result, since the first chip enablement pads 510 and the second chip enablement pads 520 are connected to the first and second connection terminals 810A and 810B of the chip enablement connection terminals 810, the number of the chip enablement connection terminals 810 connected to the first and second chip enablement pads 510 and 520 may be reduced.

In order to connect the chip enablement pad selection finger 230 to a connection terminal 830 for chip enablement pad selection, a routing portion 730 for chip enablement pad selection may be disposed in the package substrate 100. In addition, the chip enablement pad selection routing portion 730 may be disposed to electrically connect the chip enablement pad selection connection terminal 830 to the first and second chip selection auxiliary fingers 240 and 250 which are adjacent to the chip enablement pad selection finger 230. Accordingly, a control signal may be applied to the chip enablement pad selection finger 230 and the first and second chip selection auxiliary fingers 240 and 250.

Figure 4:
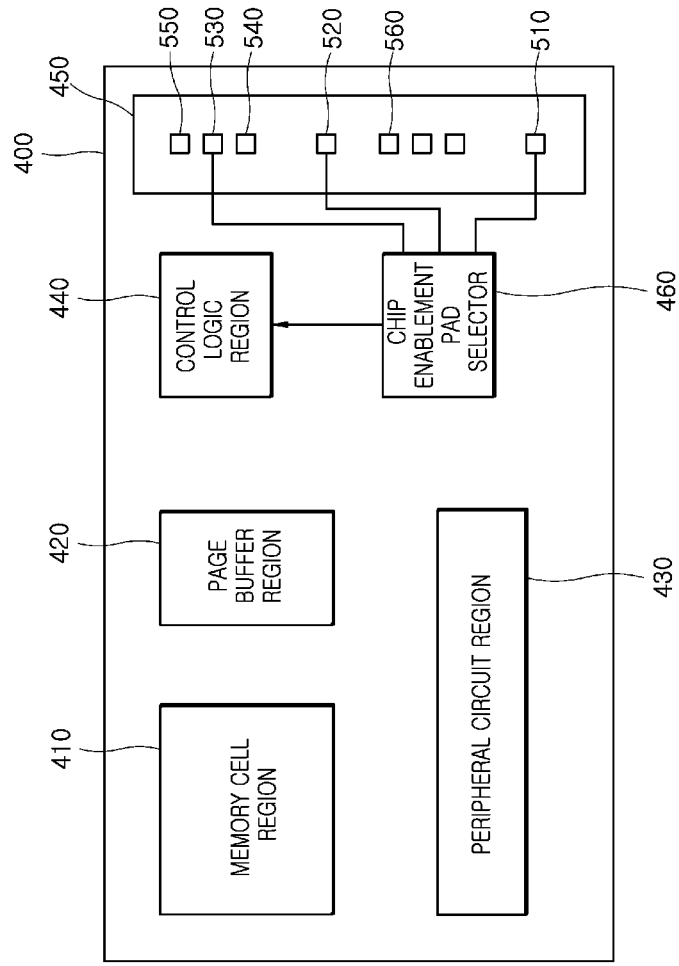
FIG. 4 is a diagram illustrating an example of a semiconductor chip of a semiconductor package according to an embodiment.

FIG. 4 is a diagram illustrating an example of the semiconductor chips 400 of the semiconductor package 10 illustrated in FIG. 1. Referring to FIG. 4, the semiconductor chip 400 may include a NAND flash memory device. Specifically, the semiconductor chip 400 may include a memory cell region 410 in which a program operation (i.e., a write operation), an erasure operation and a read operation of data are performed, a page buffer region 420, and a peripheral circuit region 430. In addition, the semiconductor chip 400 may further include a control logic region 440, which controls a chip selection operation, and a chip enablement pad selector 460, which provides a selection signal for selecting the first or second chip enablement pads 510 or 520 to the control logic region 440. Moreover, the semiconductor chip 400 may further include a chip pad region 450 in which the first and second chip enablement pads 510 and 520, the data signal pads 560, the chip enablement pad selection pads 530, the first chip selection auxiliary pads 540, and the second chip selection auxiliary pads 550 are disposed. Although FIG. 4 illustrates some elements that the NAND flash memory device may have, the present disclosure is not limited thereto. For example, the semiconductor chip 400 may include any type of semiconductor device other than the NAND flash memory device.

Figure 5:
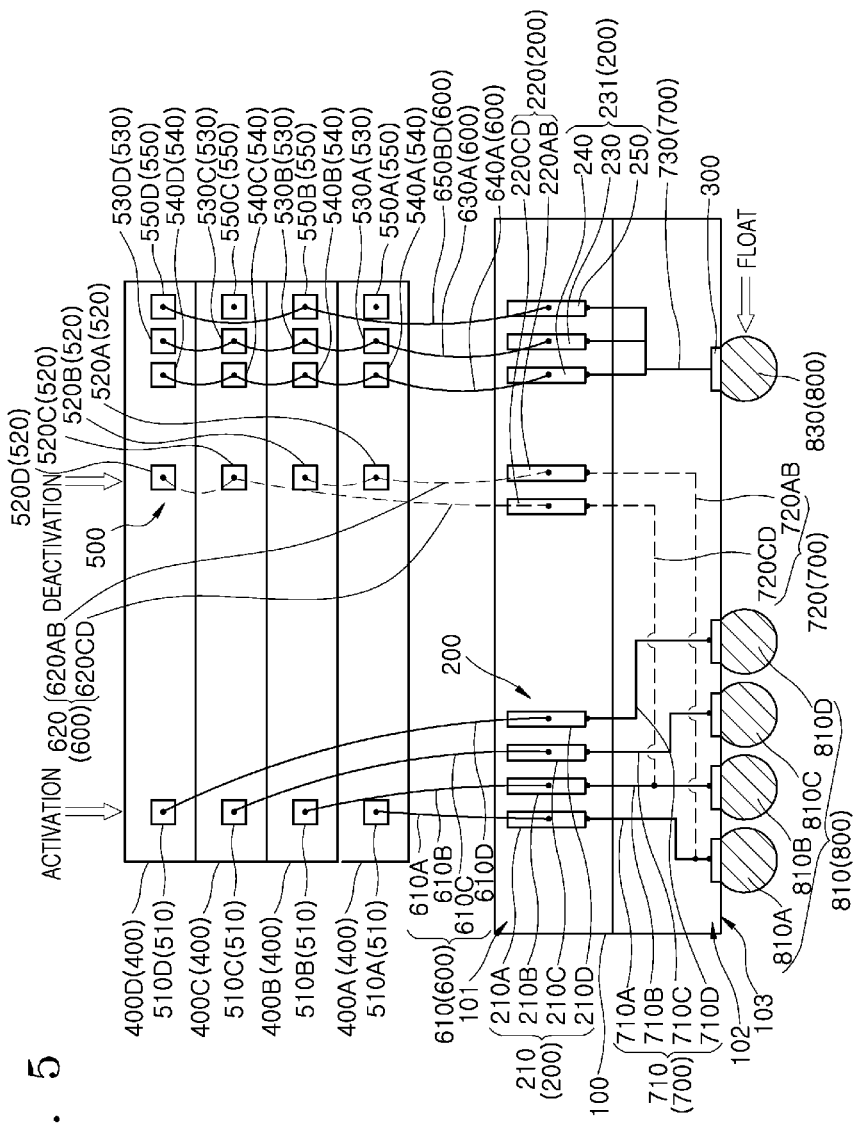
FIG. 5 is a diagram explaining an example operation performed during a first chip selection mode of a semiconductor package according to an embodiment.

FIG. 5 is a diagram explaining an example operation performed during a first chip selection mode of the semiconductor package illustrated in FIGS. 1, 2 and 3. Referring to FIG. 5, the chip enablement pad selection connection terminal 830 may be electrically isolated, and may be floating. If the chip enablement pad selection finger 230 and the first and second chip selection auxiliary fingers 240 and 250 connected to the chip enablement pad selection connection terminal 830 are floating, a first activation signal selecting the first chip enablement pads 510 may be applied to the semiconductor chips 400. The first chip enablement pads 510 of the semiconductor chips 400 may be enabled by the first activation signal, and the second chip enablement pads 520 of the semiconductor chips 400 may be disabled by the first activation signal. Any one of the semiconductor chips 400 may be selected using the first chip enablement pads 510A-510D activated. A connection structure of the first chip enablement pads 510A-510D, the first chip enablement fingers 210A-210D, the first chip enablement connectors 610A-610D, the first chip enablement routing portions 710A-710D, and the chip enablement connection terminals 810A-810D may be used to select any one of the semiconductor chips 400. A first chip selection mode for selecting a specific one of the semiconductor chips 400 using four chip enablement signals, for example, a four-chip-enablement-signal, quad-die-package (4CE_QDP) mode may be applied to an operation of a semiconductor package having a quad-die package (QDP) structure.

Figure 6:
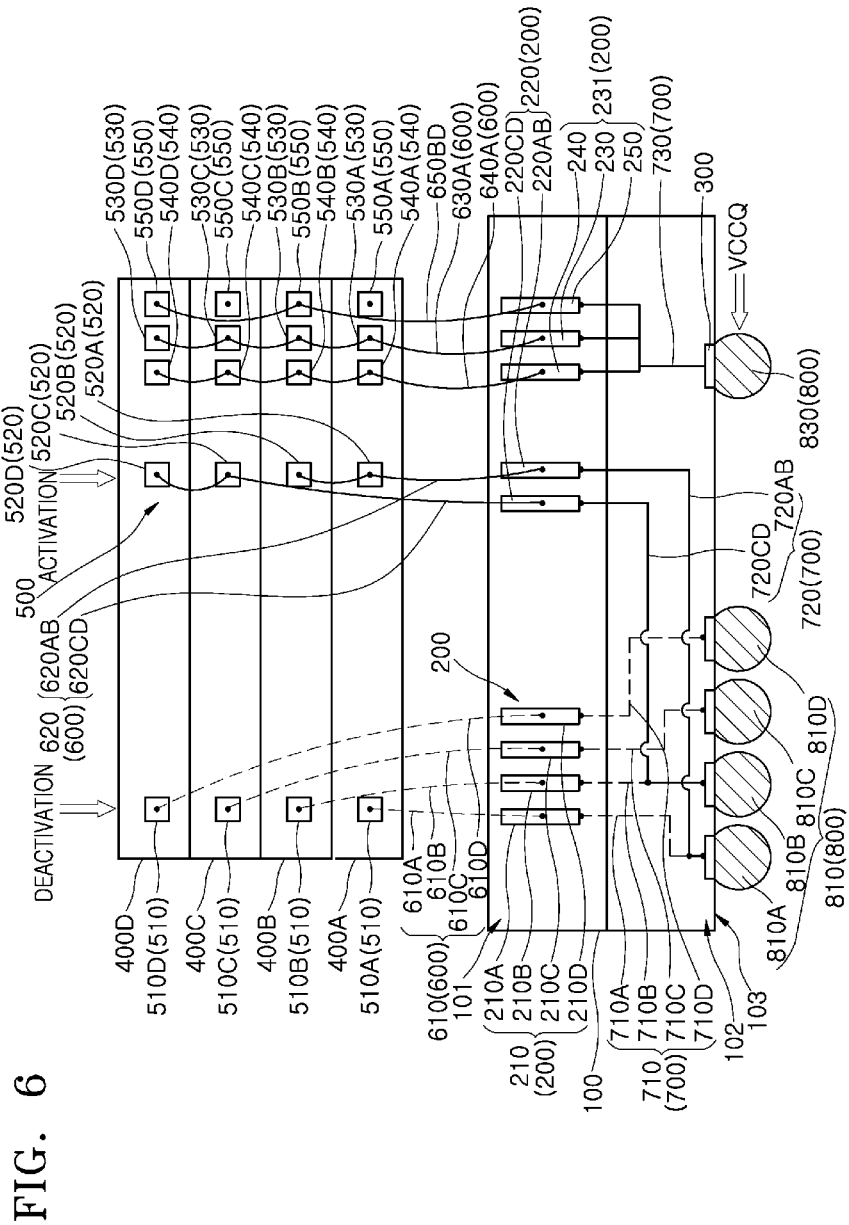
FIG. 6 is a diagram explaining an example operation performed during a second chip selection mode of a semiconductor package according to an embodiment.

FIG. 6 is a diagram explaining an example operation performed during a second chip selection mode of the semiconductor package illustrated in FIGS. 1, 2 and 3. Referring to FIG. 6, if a power supply voltage VCC corresponding to a logic "high" level is applied to the chip enablement pad selection connection terminal 830, the power supply voltage VCC may be applied to the chip enablement pad selection finger 230, the chip enablement pad selection connector 630A and the chip enablement pad selection pad 530 which are connected to the chip enablement pad selection connection terminal 830. In such a case, a second activation signal may be applied to the semiconductor chips 400. Accordingly, the second chip enablement pads 520 of the semiconductor chips 400 may be activated to have an enabled status, and the first chip enablement pads 510 of the semiconductor chips 400 may be deactivated (disabled).

Since the first and second chip selection auxiliary fingers 240 and 250 are connected to the chip enablement pad selection connection terminal 830 through the chip enablement pad selection routing portion 730, the power supply voltage VCC may also be applied to the first and second chip selection auxiliary fingers 240 and 250. In such a case, the power supply voltage VCC may also be applied to the first chip selection auxiliary pads 540 through the first chip selection auxiliary finger 240 and the first chip selection auxiliary connector 640A. Thus, the semiconductor chips 400A, 400B, 400C and 400D may be recognized as forming a dual die package (DDP) structure, and a first control signal (e.g., SD_SEL signal) may be applied to the semiconductor chips 400. In addition, the power supply voltage VCC having a logic "high" level may be applied to the second and fourth pads 550B and 550D of the second chip selection auxiliary pads 550 through the second chip selection auxiliary finger 250 and the second chip selection auxiliary connector 650BD, and the first and third pads 550A and 550C of the second chip selection auxiliary pads 550 may float. Thus, the second and fourth semiconductor chips 400B and 400D may be recognized as constituting one group of the semiconductor chips 400, and the first and third semiconductor chips 400A and 400C may be recognized as constituting the other group of the semiconductor chips 400. In such a case, any one of the second and fourth semiconductor chips 400B and 400D may be selected using a connection structure of the second chip enablement pads 520A-520D and the second chip enablement connectors 620AB and 620CD, and any one of the first and third semiconductor chips 400A and 400C may also be selected using the connection structure of the second chip enablement pads 520A-520D and the second chip enablement connectors 620AB and 620CD. While the second semiconductor chip 400B is connected to the first connector 620AB of the second chip enablement connectors 620, the fourth semiconductor chip 400D may not be connected to the first connector 620AB of the second chip enablement connectors 620. Thus, the second semiconductor chip 400B may be selected between the second and fourth semiconductor chips 400B and 400D by a signal applied to the second semiconductor chip 400B through the first connector 620AB of the second chip enablement connectors 620. Similarly, while the first semiconductor chip 400A is connected to the first connector 620AB of the second chip enablement connectors 620, the third semiconductor chip 400C may not be connected to the first connector 620AB of the second chip enablement connectors 620. Thus, the first semiconductor chip 400A may be selected between the first and third semiconductor chips 400A and 400C by a signal applied to the first semiconductor chip 400A through the first connector 620AB of the second chip enablement connectors 620.

While the third semiconductor chip 400C is connected to the second connector 620CD of the second chip enablement connectors 620, the first semiconductor chip 400A may not be connected to the second connector 620CD of the second chip enablement connectors 620. Thus, the third semiconductor chip 400C may be selected between the first and third semiconductor chips 400A and 400C by a signal applied to the third semiconductor chip 400C through the second connector 620CD of the second chip enablement connectors 620. Similarly, while the fourth semiconductor chip 400D is connected to the second connector 620CD of the second chip enablement connectors 620, the second semiconductor chip 400B may not be connected to the second connector 620CD of the second chip enablement connectors 620. Thus, the fourth semiconductor chip 400D may be selected between the second and fourth semiconductor chips 400B and 400D by a signal applied to the fourth semiconductor chip 400D through the second connector 620CD of the second chip enablement connectors 620.

As described above, one of the semiconductor chips 400 may be selected using a connection structure of the second chip enablement pads 520A-520D, the second chip enablement connectors 620AB and 620CD, the second chip enablement routing portions 720AB and 720CD and the chip enablement connection terminals 810A and 810B as well as a connection structure including the first and second chip selection auxiliary fingers 240 and 250. Accordingly, a second chip selection mode for selecting a specific one of the semiconductor chips 400 using two chip enablement signals, for example, a two-chip-enablement-signal, dual-die-package (2CE_DDP) operation mode may be realized in a semiconductor package including two pairs of dual-die package (DDP) structures.

The semiconductor package 10 according to an embodiment may select one of the semiconductor chips 400 using a chip selection operation mode with two chip enablement signals or four chip enablement signals according to whether a signal (e.g., a power supply voltage VCC) having a logic "high" level is applied to the chip enablement pad selection connection terminal 830.

Figure 7:
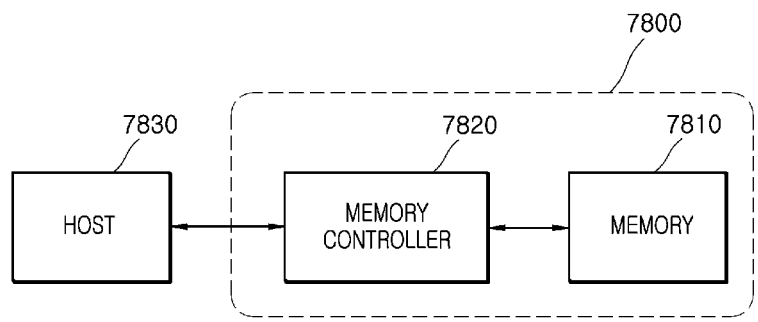
FIG. 7 is a diagram illustrating an example of an electronic system employing a memory card including at least one of packages according to some embodiments.

FIG. 7 is a diagram illustrating an example of an electronic system including a memory card 7800. Here, the memory card 7800 may include at least one of the semiconductor packages according to an embodiment. The memory card 1800 may include a memory 7810 such as a nonvolatile memory device, and a memory controller 7820. The memory 7810 and the memory controller 7820 may store data or read stored data. The memory 7810 and/or the memory controller 7820 may include one or more semiconductor chips disposed in a semiconductor package according to an embodiment.

The memory 7810 may include a nonvolatile memory device to which the technology of the embodiments of the present invention is applied. The memory controller 7820 may control the memory 7810 such that stored data is read out or data is stored in response to a read/write request from a host 7830.

Figure 8:
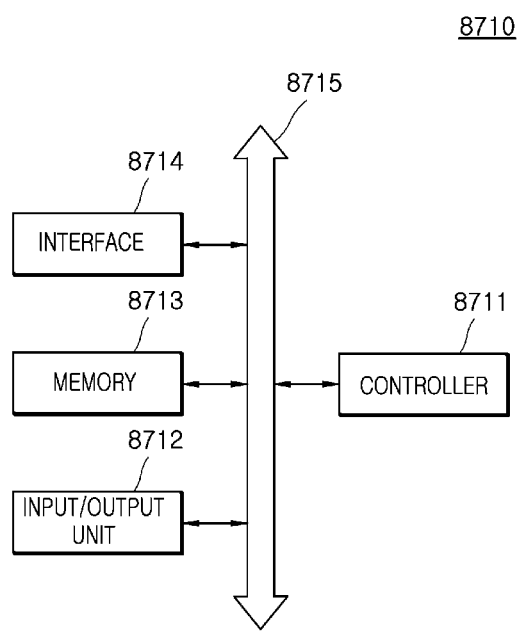
FIG. 8 is a diagram illustrating an example of an electronic system including at least one of packages according to some embodiments.

FIG. 8 is a diagram illustrating an example of an electronic system 8710 including at least one of the packages according to an embodiment. The electronic system 8710 may include a controller 8711, an input/output device 8712 and a memory 8713. The controller 8711, the input/output device 8712 and the memory 8713 may be coupled to one another through a bus 8715 providing a path for a data communication.

In an embodiment, the controller 8711 may include one or more of a microprocessor, a digital signal processor, a microcontroller, and/or a logic device capable of performing the same functions as these components. The controller 8711 or the memory 8713 may include one or more of the semiconductor packages according to embodiments of the present disclosure. The input/output device 8712 may include at least one selected between a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted on an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system such as of Code Division Multiple Access (CDMA), Global System for Mobile communications (GSM), North American Digital Cellular (NADC), Enhanced Time Division Multiple Access (E-TDMA), Wideband Code Division Multiple Access (WCDMA), CDMA2000, Long Term Evolution (LTE) and Wireless Broadband Internet (Wibro).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
a package substrate having first chip enablement fingers, second chip enablement fingers, a chip enablement pad selection finger, and a chip selection auxiliary finger, the first chip enablement fingers including first to fourth fingers, the second chip enablement fingers including first and second fingers;
a first semiconductor chip disposed on the package substrate and having a first pad of first chip enablement pads, a first pad of second chip enablement pads, a first pad of chip enablement pad selection pads, and a first pad of chip selection auxiliary pads;
a second semiconductor chip disposed on the first semiconductor chip and having a second pad of the first chip enablement pads, a second pad of the second chip enablement pads, a second pad of the chip enablement pad selection pads, and a second pad of the chip selection auxiliary pads;
a third semiconductor chip disposed on the second semiconductor chip and having a third pad of the first chip enablement pads, a third pad of the second chip enablement pads, a third pad of the chip enablement pad selection pads, and a third pad of the chip selection auxiliary pads;
a fourth semiconductor chip disposed on the third semiconductor chip and having a fourth pad of the first chip enablement pads, a fourth pad of the second chip enablement pads, a fourth pad of the chip enablement pad selection pads, and a fourth pad of the chip selection auxiliary pads;
a first connector of first chip enablement connectors electrically connecting the first finger of the first chip enablement fingers to the first pad of the first chip enablement pads;
a second connector of the first chip enablement connectors electrically connecting the second finger of the first chip enablement fingers to the second pad of the first chip enablement pads;
a third connector of the first chip enablement connectors electrically connecting the third finger of the first chip enablement fingers to the third pad of the first chip enablement pads;
a fourth connector of the first chip enablement connectors electrically connecting the fourth finger of the first chip enablement fingers to the fourth pad of the first chip enablement pads;
a first connector of second chip enablement connectors electrically connecting both of the first and second pads of the second chip enablement pads to the first finger of the second chip enablement fingers;
a second connector of the second chip enablement connectors electrically connecting both of the third and fourth pads of the second chip enablement pads to the second finger of the second chip enablement fingers;

a chip enablement pad selection connector electrically connecting all of the first to fourth pads of the chip enablement pad selection pads to the chip enablement pad selection finger; and a chip selection auxiliary connector electrically connecting both of the second and fourth pads of the chip selection auxiliary pads to the chip selection auxiliary finger, wherein the first to fourth pads of the first chip enablement pads or the first to fourth pads of the second chip enablement pads are selectively activated according to a signal applied to the chip enablement pad selection finger.

2. The semiconductor package of claim 1, wherein the package substrate further includes:

a first chip enablement connection terminal connected to the first finger of the first chip enablement fingers;

a second chip enablement connection terminal connected to the second finger of the first chip enablement fingers;

a third chip enablement connection terminal connected to the third finger of the first chip enablement fingers;

a fourth chip enablement connection terminal connected to the fourth finger of the first chip enablement fingers;

a first routing portion electrically connecting the first finger of the second chip enablement fingers to the first chip enablement connection terminal; and a second routing portion electrically connecting the second finger of the second chip enablement fingers to the second chip enablement connection terminal.

3. The semiconductor package of claim 1, wherein the package substrate further includes:

a connection terminal for chip enablement pad selection connected to the chip enablement pad selection finger; and a third routing portion electrically connecting the chip selection auxiliary finger to the connection terminal for the chip enablement pad selection.

4. The semiconductor package of claim 1, wherein one of the first and second semiconductor chips is selected by a signal applied to the second pad of the chip selection auxiliary pads through the chip selection auxiliary connector.

* * * * *